(12) United States Patent
Steinhoff (10) Patent No.: US 7,245,466 B2
(45) Date of Patent: Jul. 17, 2007

(54) PUMPED SCR FOR ESD PROTECTION

(75) Inventor: Robert M. Steinhoff, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 601 days.

(21) Appl. No.: 10/690,011

(22) Filed: Oct. 21, 2003

(65) Prior Publication Data

US 2005/0083619 A1   Apr. 21, 2005

(51) Int. Cl.
  *H02H 9/00* (2006.01)
(52) U.S. Cl. ....................................... 361/56
(58) Field of Classification Search ............. 361/56
  See application file for complete search history.

(56) References Cited

U.S. PATENT DOCUMENTS

| | | | |
|---|---|---|---|
| 5,400,202 A * | 3/1995 | Metz et al. ............. | 361/56 |
| 5,465,189 A | 11/1995 | Polgreen et al. | |
| 5,671,111 A * | 9/1997 | Chen ...................... | 361/56 |
| 5,909,347 A * | 6/1999 | Yu ......................... | 361/56 |
| 5,959,820 A * | 9/1999 | Ker et al. ................ | 361/111 |
| 6,147,538 A | 11/2000 | Andresen et al. | |
| 6,177,298 B1 * | 1/2001 | Quigley .................. | 438/135 |
| 6,233,130 B1 | 5/2001 | Lin | |
| 6,310,379 B1 | 10/2001 | Andresen et al. | |
| 6,476,422 B1 | 11/2002 | Yu | |
| 6,538,266 B2 * | 3/2003 | Lee et al. ............... | 257/173 |
| 6,560,081 B1 | 5/2003 | Vashchenko et al. | |
| 6,570,225 B2 | 5/2003 | Parat et al. | |
| 6,570,226 B1 | 5/2003 | Groeseneken et al. | |
| 6,580,184 B2 | 6/2003 | Song | |
| 6,590,261 B2 * | 7/2003 | Su et al. ................. | 257/355 |
| 6,594,132 B1 | 7/2003 | Avery | |
| 6,867,957 B1 * | 3/2005 | Tong et al. .............. | 361/56 |
| 6,909,149 B2 * | 6/2005 | Russ et al. .............. | 257/355 |
| 2002/0089017 A1 * | 7/2002 | Lai et al. ................ | 257/355 |

\* cited by examiner

*Primary Examiner*—Ronald W. Leja
(74) *Attorney, Agent, or Firm*—Jacqueline J. Garner; W. James Brady, III; Frederick J. Telecky, Jr.

(57) ABSTRACT

An ESD protection device can include a silicon-controlled rectifier (SCR) and an external pumping circuit. The external pumping circuit can be used to forward bias a junction of the SCR. The external pumping circuit can comprise a transistor that can be coupled to a region of the SCR to pump the region.

21 Claims, 5 Drawing Sheets

PUMPED SCR FOR ESD PROTECTION

TECHNICAL FIELD

The present invention relates generally to protection devices for integrated circuits, and more particularly to a device for protecting integrated circuits from electrostatic discharge (ESD).

BACKGROUND OF THE INVENTION

Semiconductor integrated circuits fabricated by CMOS (complementary metal-oxide-semiconductor) techniques are sensitive to an ESD event, which may be caused by contact with a human body, for example. These circuits are adversely affected by an excessively high incoming voltage (or current) from the ESD event. Such an ESD event accompanied by an excessive high voltage (or current) causes thin isolation layers of the circuits to be damaged destructively, and/or channels thereof to be shorted, often resulting in malfunctions or operational failure of integrated circuits.

ESD protection devices can be employed in integrated circuits to obviate physical damage caused by an ESD event. Such ESD protection devices are usually set between the pins of integrated circuit and inputs pads and discharge a transient voltage to the outside of an integrated circuit, in order to prevent the transient voltage from being applied to internal circuitry of the integrated circuit. Generally, the trigger voltage and holding voltage of an ESD protection device can define its performance. The lower the trigger voltage and holding voltage, the better the performance the ESD protection device can have. Thus, many designs of ESD protection devices are employed to provide lower trigger voltages and holding voltages.

Figure 1A:
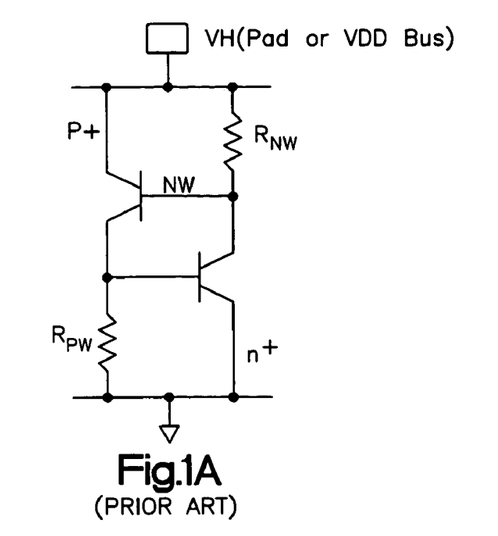
FIG. 1A illustrates a schematic circuit diagram of a conventional SCR.
Figure 1B:
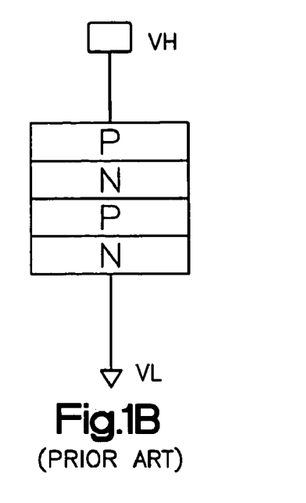
FIG. 1B illustrates a schematic diagram of the conventional SCR of FIG. 1A.
Figure 1C:
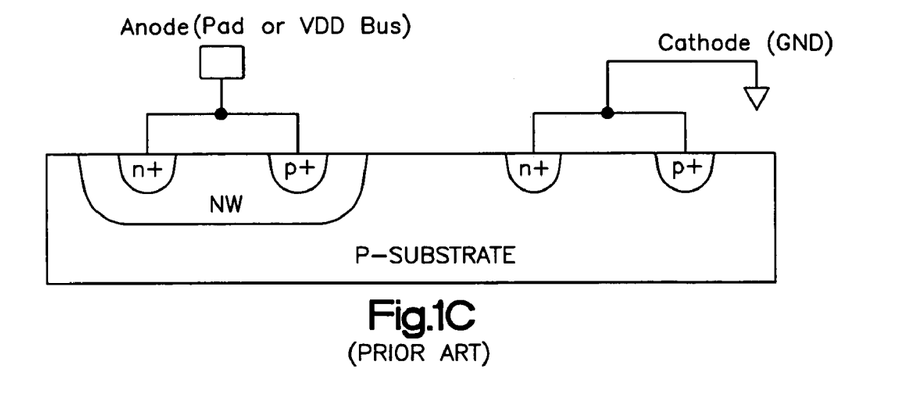
FIG. 1C illustrates a schematic cross-sectional view of part of the conventional SCR of FIG. 1A.

An example of an ESD protection device that can be used for protection of an integrated circuit (IC) from an ESD event is a silicon-controlled rectifier (SCR). FIGS. 1A, 1B; and 1C show the basic structure of an SCR. The anode of an SCR can be connected to an IC pin, while the cathode of the SCR can be connected to a ground, for ESD protection of the IC pin. Alternatively, the anode can be connected to a power bus to prevent the IC from being damaged during an ESD event on the power bus. The SCR is triggered by n-well to p-substrate junction breakdown, which is relatively high, for instance, typically >20 V. This high breakdown voltage is a drawback when an SCR is used as an ESD protection element since it may not trigger soon enough during an ESD event to protect other circuit elements from ESD damage.

Figure 2A:
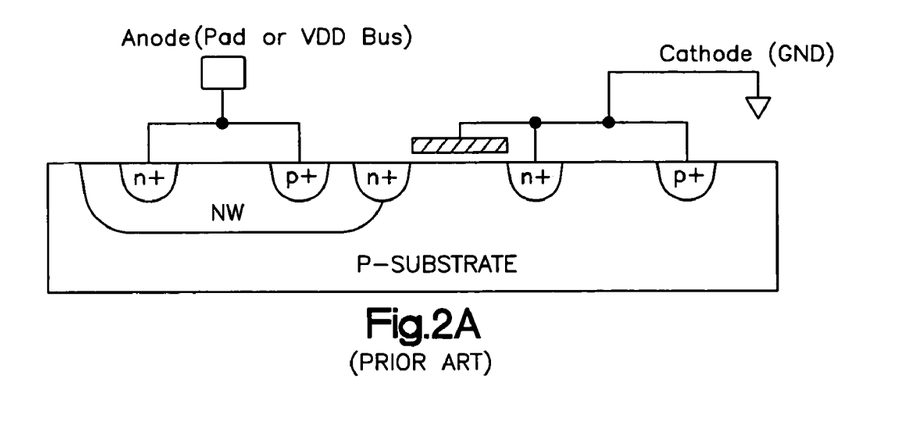
FIG. 2A illustrates a schematic cross-sectional view of a conventional low-voltage triggering SCR.
Figure 2B:
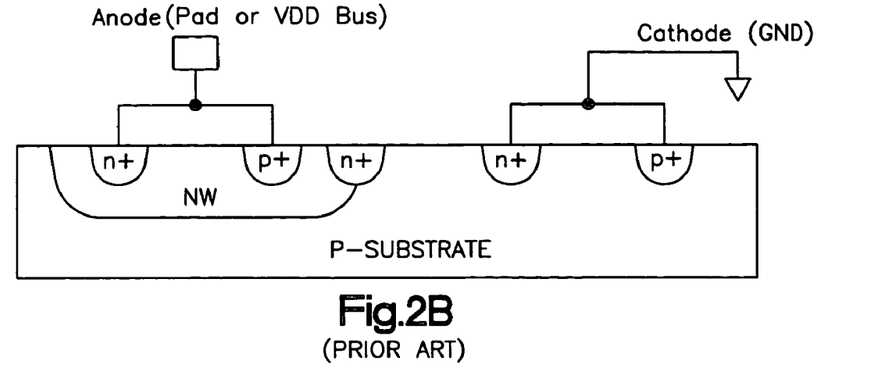
FIG. 2B illustrates a schematic cross-sectional view of another conventional low-voltage trigger SCR.

U.S. Pat. No. 5,465,189 describes an SCR used to provide on-chip protection against ESD stress applied at the input, output, power-supply bus, or between any arbitrary pair of pins of an integrated circuit. An n-type metal oxide semiconductor field effect transistor (nMOSFET) having a low breakdown voltage is incorporated into the SCR to lower the trigger voltage of the SCR. FIG. 2A shows a low-voltage trigger SCR, according to U.S. Pat. No. 5,465,189, which integrates an nMOSFET with the SCR, such that the trigger voltage of the SCR is equal to the trigger voltage of the nMOSFET, which is typically roughly at or lower than 12 volts. FIG. 2B shows a variation of FIG. 2A in which an integrated lateral bipolar device, instead of nMOSFET, is provided to reduce the trigger voltage of an SCR.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention relates generally to an ESD protection device for bypassing electrostatic discharges from a protected node (e.g., input pad) to a reference potential (e.g., grounded node). The ESD protection device can include a silicon-controlled rectifier (SCR) and an external pumping circuit. The external-pumping circuit can be used to forward bias a junction of the SCR to provide a faster trigger and a lower holding voltage compared to an SCR in which the junction is not pumped. The pumping circuit can comprise a transistor, such as an nMOSFET, a pMOSFET, an npn bipolar transistor, or an pnp bipolar transistor, that can be electrically coupled to a region (e.g., n-type region or p-type region) of the SCR.

In an aspect of the present invention, the SCR can include a base region of a first conductivity type (e.g., p-type semiconductor substrate), a well region of a second conductivity type formed in the base region (e.g., n-well), a first region of the first conductivity type formed in the well region (e.g., nmoat), a second region of the second conductivity type formed in the well region (e.g., pmoat), a third region of the second conductivity type formed in the base region (e.g., nmoat), a fourth region of the first conductivity type formed in the base region (e.g., pmoat), a fifth region of a second conductivity type formed at the interface between the well region and the base region (e.g., nmoat) The first, second, third, fourth, and fifth region can be aligned substantially parallel to one another and can each have a first width (e.g., about 80 μm). The transistor (e.g., nMOSFET) of the external pumping circuit can comprise a sixth region of the first conductivity type (or second conductivity type) and a seventh region of the first conductivity type (or second conductivity type) that are formed in a second base region. The sixth region and the seventh region can have a second width (e.g., about 250 μm) that can be greater than the first width (e.g., about 80 μm) of the SCR. By providing the transistor with a greater width than the SCR, a pumping current can be provided that is effective to forward bias a junction (e.g., emitter-base junction of a pnp bipolar transistor) of the SCR.

BRIEF DESCRIPTION OF THE DRAWINGS

The foregoing and other aspects of the present invention will become apparent to those skilled in the art to which the present invention relates upon reading the following description with reference to the accompanying drawings.

DETAILED DESCRIPTION

The present invention relates generally to an ESD protection device for bypassing electrostatic discharges from a protected node (e.g., input pad) to a reference potential (e.g., grounded node). The ESD protection device can include a silicon controlled rectifier (SCR) and pumping circuit external to the SCR's structure. The pumping circuit can be used to forward bias a junction of the SCR to provide a faster trigger and a lower holding voltage compared to an SCR in which the junction is not pumped. The pumping circuit can comprise a transistor, such as an nMOSFET, a pMOSFET, an npn bipolar transistor, or an pnp bipolar transistor, that can be electrically coupled to a region (e.g., n-type region or p-type region) of the SCR.

Figure 3:
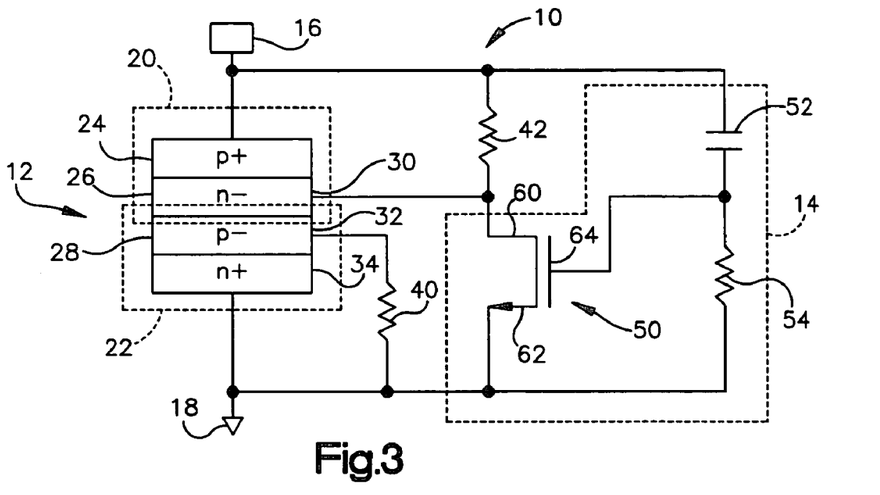
FIG. 3 illustrates a schematic circuit diagram of an ESD protection device in accordance with one aspect of the invention.

FIG. 3 illustrates a schematic circuit design of an ESD protection device 10 in accordance with an aspect of the present invention. The ESD protection device 10 includes a silicon-controlled rectifier (SCR) 12 and an external pumping circuit 14. The SCR 12 and the external pumping circuit 14 are electrically coupled in parallel between a protected node 16 and a grounded node 18. The protected node 16 can comprise an input terminal configured to receive an ESD event. The protected node 16 can be, for example, a protected pin of an I/O pad or any other node that might experience an ESD event (e.g., VDD bus). The grounded node can be, for example, a reference voltage terminal or VSS bus.

The SCR 12 includes a first transistor 20 and a second transistor 22. The first transistor 20 can be a pnp bipolar transistor and the second transistor 22 can be an npn bipolar transistor. The pnp bipolar transistor 20 includes an emitter 24, a base 26, and a collector 28, and the npn bipolar transistor 22 includes a collector 30, a base 32, and an emitter 34. The emitter 24 of the pnp bipolar transistor 20 can be electrically coupled to the protected node 16, and can, therefore, be configured to receive and ESD event signal from the protected node 16. The emitter 34 of the npn bipolar transistor 22 can be electrically coupled to the grounded node 18. The emitter 34 of the npn bipolar transistor 22 can also be electrically coupled to the base 32 of the npn bipolar transistor 22 through a resistor 40. The resistor 40 can be a parasitic resistance built into the SCR 12 or can be external to the SCR (e.g., a thin film layer of polysilicon).

The base 26 of the pnp bipolar transistor 20 can be coupled to a collector 30 of the npn bipolar transistor 22, and the collector 28 of the pnp bipolar transistor 20 can be coupled to the base 32 of the npn bipolar transistor 22. The base 26 of the pnp bipolar transistor 20 and the collector 30 of the npn bipolar transistor 22 can be electrically coupled to the protected node 16 through a resistor 42. The resistor 42 can be a parasitic resistance built into the SCR 12 or can be external to the ESD protection device 10 (e.g., a thin film layer of polysilicon on a semiconductor substrate). The base 32 of the npn bipolar transistor 22 and the collector 28 of the pnp bipolar transistor 20 can be electrically coupled to the grounded node 18 through the resistor 40.

The external pumping circuit 14 can be electrically coupled between the base 26 of the pnp bipolar transistor 20 (or collector 30 of the npn bipolar transistor 22) and the ground node 18 as well as the protected node. The external pumping circuit 14 can include a transistor 50, such as an nMOSFET, and trigger elements, such as a capacitor 52 and a resistor 54. The nMOSFET 50 includes a drain 60, a source 62, and a gate 64. The drain 60 can be electrically coupled to the base 26 of the pnp bipolar transistor 20 (or the collector 30 of the npn bipolar transistor 22). The source 62 can be electrically coupled to the grounded node 18 and the emitter 34 of the npn bipolar transistor 22. The gate 64 can be electrically coupled to the protected node 16 through the capacitor 52 and to the grounded node 18 and source 62 through the resistor 54.

A trigger voltages of the SCR 12 can be defined by the threshold voltage of the nMOSFET 50 of the external pumping circuit 14. The SCR 12 of the ESD protection device can be conductive (or turned on) when a voltage between the protected node 16 and grounded node 18 rises to greater than the threshold voltage of the nMOSFET 50. Under a normal operating voltage from the protected node 16, the emitter-base junctions of the pnp bipolar transistor 20 and the npn bipolar transistor 22 are not forward biased, and very little current is conducted by the ESD protection device 10. The drain junction of the nMOSFET is reverse biased in a high impedance state.

Upon the occurrence of an ESD event, such as a voltage spike at the protected node 16 the nMOSFET 50 can pump an avalanche generated current to the base 26 of the pnp bipolar transistor 20 to pull down (i.e., lower) the voltage of the base 26. The emitter-base junction of the pnp bipolar transistor 20 can be forward biased to form a current path from the base 26 of the pnp bipolar transistor 20 to the grounded node 18. That is, a voltage drop occurs through the resistor 42, so that the emitter-base junction of the pnp bipolar transistor 20 becomes forward biased. Holes at the protected node 16 can flow to the grounded node 18 through the collector 28 of the pnp bipolar transistor 28. Accordingly, the pnp bipolar transistor 20 is turned on. A voltage drop also occurs through the resistor 40 causing the npn bipolar transistor 22 to be conductive. Electrons from the grounded node 18 flow to the protected node 16 through the npn bipolar transistor 22. As a result, a positive feedback loop is formed to accelerate current flow for a discharge operation. The pnp bipolar transistor 20 and the npn bipolar transistor 22 provide base bias voltages for each other allowing the ESD protection device to remain conductive in a much lower holding voltage than the avalanche voltage.

Figure 4:
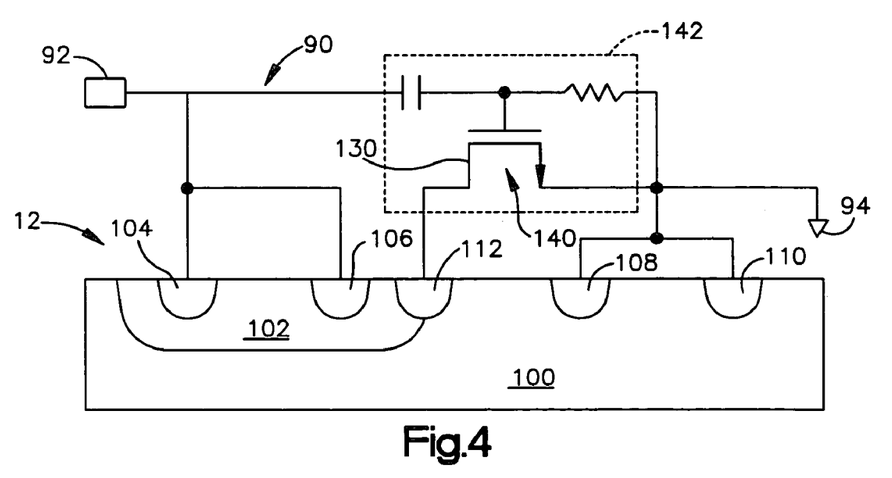
FIG. 4 illustrates a schematic cross-sectional view of an SCR of the ESD protection device of FIG. 3.

FIG. 4. illustrates a cross-sectional view of an SCR 90 for the ESD protection device 10 in accordance with an aspect of the invention. The SCR 90 can be constructed from a p-type substrate 100. The substrate 100 can be formed from a semiconductor material, such as silicon or polysilicon, that is doped with a p-type dopant such as boron (B) or any other p-type dopant. The substrate 100, however, could be formed from any material, such as gallium arsenide, germanium, silicon germanium, epitaxial formations, silicon carbide, indium phosphide, silicon-on-insulator substrates (SOI), strained Si substrates and/or other semiconductor substrate materials. The substrate 100 can function as the collector 28 (FIG. 3) of the pnp bipolar transistor 20 and the base 32 of the npn bipolar transistor 22.

The SCR 12 can include an n-well region 102 that is formed in the p-type substrate material 100, by selectively doping the p-type substrate 100 with an n-type dopant, such as phosphorous (P) or arsenic (As). The n-well region 102 can function as the base 26 of the pnp bipolar transistor 20 (FIG. 3) and the collector 30 of the npn bipolar transistor 22.

During formation of the n-well region 102 in the p-type substrate 100, a patterned photoresist (not shown) can be provided over the p-type substrate 100 to form a mask, that defines the area of the n-well region 102. After formation of the n-well region, the mask can be stripped off the p-type substrate 100 and the p-type substrate 100 can be cleaned by cleanup processes, such as wet chemical cleanup processes or any other cleanup process familiar to one skilled in the art.

A first region 104 doped with an $n^+$ type dopant and a second region 106 doped with a $p^+$ type dopant can be formed in the n-well region 102 by selectively implanting the n-well region 102 with an $n^+$ type dopant and a $p^+$ type dopant. The $n^+$ type dopant can include any $n^+$ type dopant, such as P or As. The $p^+$ type dopant can include any $p^+$ type dopant, such as B or boron 11 ($B_{11}$).

During formation of the first region 104 and the second region 106 in the n-well region 102, patterned photoresists (not shown) can be provided over the n-well region 102 and the p-type substrate 100 to form masks, that define areas of the first region 104 and second region 106, respectively. After formation of each of the first region 104 and the second region 106 the masks can be stripped off the n-well region 102 and the p-type substrate 100, and the n-well region 102 and the p-type substrate 100 can be cleaned by cleanup processes, such as wet chemical cleanup processes or any other cleanup process familiar to one skilled in the art.

The concentration of the dopants of the first region 104 and the second region 106 can be higher than the concentration of the dopant of the n-well region 102. For example, the concentration of the n-well region 102 can be in the range between about $1\times10^{15}$ cm$^{-3}$ to about $1\times10^{18}$ cm$^{-3}$, and the concentration of the first region 104 and the second region 106 can be about $1\times10^{17}$ cm$^{-3}$ to about $1\times10^{21}$ cm$^{-3}$.

Figure 5:
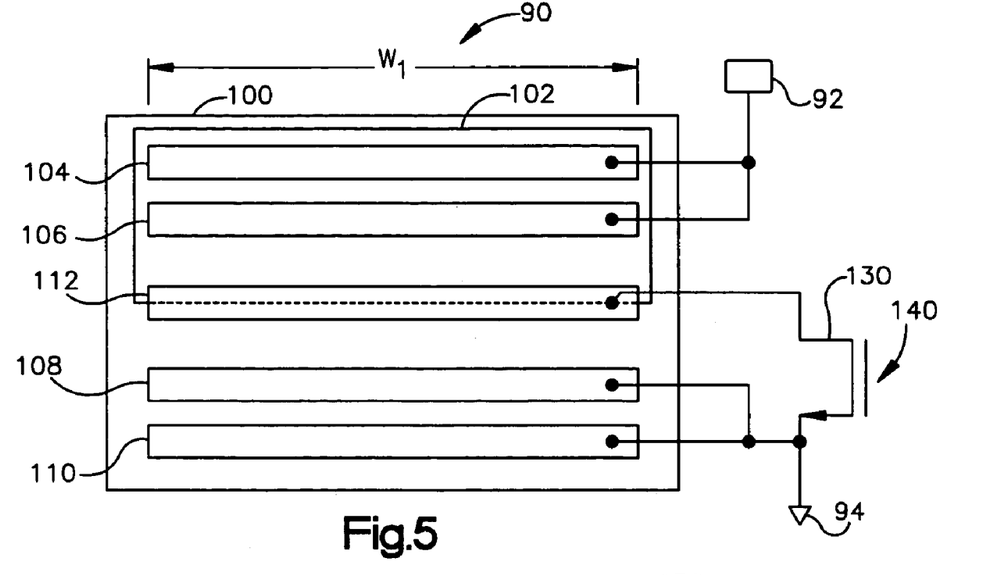
FIG. 5 illustrates a schematic top plan view of the SCR of FIG. 4.

Referring to FIG. 5, which is a top plan view of FIG. 4, the first region 104 and the second region 106 can define elongated regions (e.g., moats) that extend substantially parallel to one another within the n-well region 102 substantially the width of the n-well region 102. The first region 104 (nmoat) and the second region (pmoat) can have a first width $W_1$ (e.g., about 80 μm) that is less than the width of the n-well (e.g., about 100 μm). The first region 104 can function as the emitter 24 (FIG. 3) of the pnp bipolar transistor 20 and the anode of the SCR 12. The first region 104 and the second region 106 can be electrically coupled to a protected node 92.

Referring to FIG. 4, the SCR 90 can further include a third region 108 doped with an $n^+$ type dopant and a fourth region 110 doped with a $p^+$ type dopant. The third region, 108 and the fourth region 110 can be formed in the p-type substrate 100 by selectively implanting the p-type substrate 100 with an $n^+$ type dopant and a $p^+$ type dopant. The $n^+$ type dopant can include any $n^+$ type dopant, such as P or As. The $p^+$ type dopant can include any $p^+$ type dopant, such as B or $B_{11}$. The third region 108 and the fourth region 110 can have concentrations similar to the first region 104 and the second region 106. That is, they can have concentrations in the range of about $1\times10^{17}$ cm$^{-3}$ to about $1\times10^{21}$ cm$^{-3}$.

During formation of the third region 108 and the fourth region 110 in the p-type substrate 100, patterned photoresists (not shown) can be provided over the p-type substrate 100 to form masks, that define areas of the third region 108 and the fourth region 110, respectively. After formation of each of the third region 108 and the fourth region 110, the masks can be stripped off the p-type substrate 100, and the p-type substrate 100 can be cleaned by cleanup processes, such as wet chemical cleanup processes or any other cleanup process familiar to one skilled in the art.

Referring back to FIG. 5, the third region 108 and the fourth region 110 can define elongated regions (e.g., moats) that extend sustantially parallel to one another within the p-type substrate 100, spaced apart from the n-well region 102. The third region 108 (nmoat) and the fourth region 110 (pmoat) can also extend substantially parallel to the first region 104 and the second region 106. The third region 108 and the fourth region 110 can have a width that is essentially the same as the first width $W_1$ of the first region 104 and the second region 106. The third region 108 can function as the emitter 34 (FIG. 3) of the npn bipolar transistor 22 and the cathode of the SCR 12. The third region 108 and the fourth region 110 can be electrically coupled to the grounded node 94.

The SCR 90 can also include a fifth region 112 doped with an $n^+$ type dopant. The $n^+$ type dopant can be any $n^+$ type dopant, such as P or As. The fifth region 112 can be formed at least partially along the interface between the n-well region 102 and the p-type substrate 100.

The fifth region 112 can have a higher concentration of $n^+$ type dopants than the n-well region 102. For example, the fifth region 112 can have a concentration in the range of about $1\times10^{17}$ cm$^{-3}$ to about $1\times10^{21}$ cm$^{-3}$. During formation of the fifth region 112, patterned photoresist (not shown) can be provided over the p-type substrate 100 and n-well region 102 to form a mask, that defines the area of the fifth region 112. After formation of the fifth region 112 by implantation, the mask can be stripped off the p-type substrate 100 and the n-well region 102, and the p-type substrate 100 and n-well region 102 can be cleaned by cleanup processes, such as wet chemical cleanup processes or any other cleanup process familiar to one skilled in the art.

Referring to FIG. 5, the fifth region 112 can be in the form of an elongated region, (e.g., moat) that extends substantially parallel to the first region 104, the second region 106, the third region 108, and the fourth region 110. The width of the fifth region 112 can be substantially the same as the width $W_1$ of the first region 104, the second region 106, the third region 108, and the fourth region 110. The fifth region 112 can be electrically coupled to a drain 130 of an external pumping circuit 140. Additionally, because of the high concentration of $n^+$ type dopants compared to the n-well region 102, the fifth region 112 can be considered a pumping nmoat.

Figure 6:
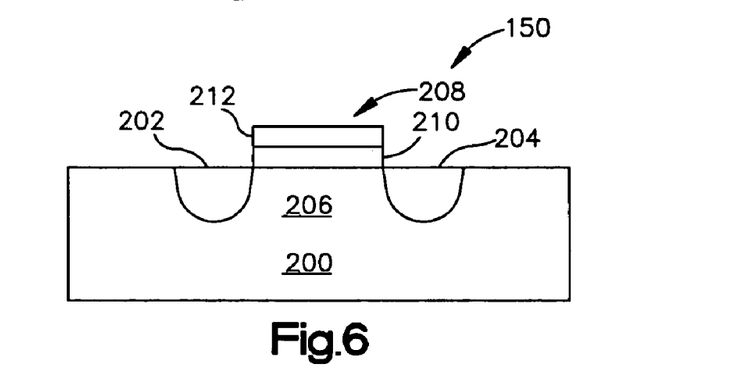
FIG. 6 illustrates a cross-sectional view of a transistor of the ESD protection device of FIG. 3.

FIG. 6 illustrates a cross-sectional view of an nMOSFET 150 of an external pumping circuit in accordance an aspect of the present invention. The nMOSFET 150 can be formed on a p-type substrate 200. The substrate material 200 can be a p-type semiconductor material, such as silicon or polysilicon, that is doped with p-type dopant such as boron (B) or any other p-type dopant. The substrate 200, however, could be formed from any material such as gallium arsenide, germanium, silicon germanium, epitaxial formations, silicon carbide, indium phosphide, silicon-on-insulator substrates (SOI), strained Si substrates and/or other semiconductor substrate materials. The p-type substrate 200 can be the same p-type substrate 100 on which the SCR 12 is formed or a different p-type substrate.

The nMOSFET 150 can include a spaced apart sixth region 202 doped with a n+ type dopant and a seventh region 204 doped with an n+ type dopant. The sixth region 202 and the seventh region 204 can be formed in the p-type substrate 200 by selectively implanting the substrate with an n+ type dopant (e.g., P). During formation of the sixth region 202 and the seventh 204 region, a patterned photoresist (not shown) can be provided over the p-type substrate 200 to form a mask, that defines the area of the sixth region 202 and the seventh region 204. After formation of the sixth region 202 and seventh region 204, the mask can be stripped off the p-type substrate 200, and the p-type substrate 100 can be cleaned by cleanup processes, such as wet chemical cleanup processes or any other cleanup process familiar to one skilled in the art.

The sixth region 202 and the seventh region 204 can function, respectively, as the drain 60 (FIG. 3) and source 62 of the nMOSFET 50. The sixth region 202 of the nMOSFET 150 can be electrically coupled to the fifth region 112 (FIG. 5) of the SCR 90, and the sixth region 204 of the nMOSFET 150 can be electrically coupled to the third region 108 of the SCR 90 and to the grounded node 94 (e.g., by connections formed from conductor materials, such as aluminum, polysilicon, or copper).

A channel region 206 can be defined between the sixth region 202 and the seventh region 204. A gate structure 208 can be defined over the channel region 206. The gate structure 208 includes a first relatively thin gate dielectric layer 210 that can be formed (e.g., by chemical vapor deposition (CVD)) over the channel region 206. The gate dielectric layer 210 can be an oxide (e.g., silicon dioxide ($SiO_2$)) or any other dielectric material suitable for use as an insulator in a MOSFET. A floating gate 212 can be formed (e.g., by CVD) over the gate dielectric layer 210. The floating gate 212 can comprise, for example, a polysilicon gate material or re-crystallized polysilicon gate material. The gate 212 can be electrically coupled to the protected node 16 (FIG. 3) through the capacitor 50 and the sixth region 204 through the resistor 54 (not shown).

Figure 7:
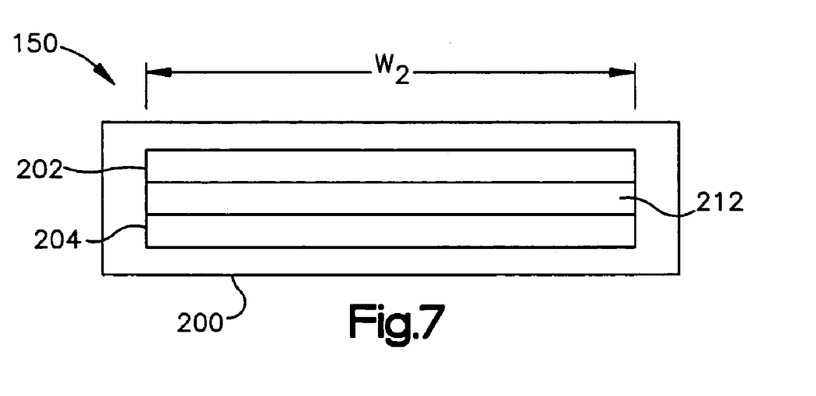
FIG. 7 illustrates a top plan view of the transistor of the ESD protection device of FIG. 6.

Referring to FIG. 7, which illustrates a top plan view of FIG. 6, the sixth region 202 and seventh region 204 comprise elongated regions that extend substantially parallel to one another within the p-type substrate 200. The sixth region 202 and the seventh region 204 can have a width $W_2$ (e.g., about 250 μm). The width $W_2$ of the sixth region 202 and the seventh region 204 relative to the width $W_1$ of the first, second, third, fourth, and fifth regions 104, 106, 108, 110, and 112 (FIG. 5) determines the current density pumped by the nMOSFET 150 (FIG. 7). The greater the ratio of the width $W_2$ of the nMOSFET 150 to the width $W_1$ of the SCR 90, the greater the pumping current. The nMOSFET 150 can be formed with a width $W_2$ (e.g., about 250 μm) that is at least about, three times greater than the width $W_1$ (e.g., about 80 μm) of the SCR 90. At a width of about three times greater, the nMOSFET 150 can provide a pumping current, upon the occurrence of an ESD event, that is effective to forward bias the top junction (i.e., emitter-base junction of the pnp bipolar transistor) of the SCR 12 (FIG. 3). By pumping the top junction of the SCR, the SCR can have a faster triggering and a lower holding voltage compared to an SCR in which the junction is not pumped.

Figure 8:
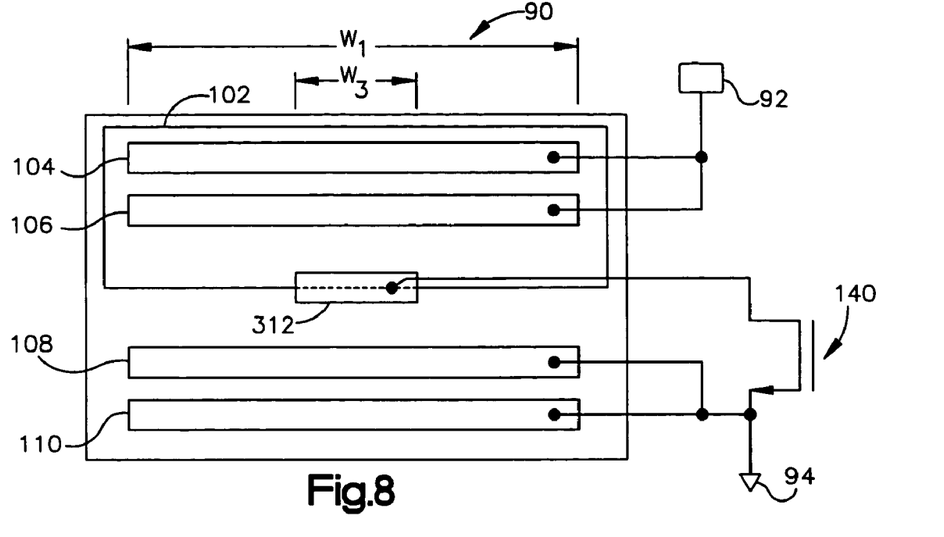
FIG. 8 illustrates a schematic top plan view of part of the ESD protection device of FIG. 3 in accordance with another aspect of the invention.

Optionally, as illustrated in FIG. 8, which is a top plan view of the SCR 90 of FIG. 4 in accordance with another aspect of the invention, the SCR 90 can be provided with a fifth region 312 (i.e., pumping nmoat) that has a width $W_3$ (e.g.; about 20 μm) that is narrower than the width $W_1$ (e.g., about 80 μm) of the first region 104, the second region 106, the third region 108, and the fourth region 110 (i.e., at least about four times narrower) and the width $W_2$ of the sixth region 202 and the seventh region 204 (i.e., at least about twelve time narrower). For a given nMOSFET width $W_2$ (i.e., the width of the sixth region 202 (FIG. 6) and the seventh region 204 of the nMOSFET 150) (e.g., about 250 μm), providing the pumping nmoat 312 with a width $W_3$ substantially smaller than the width $W_1$ of the first region 104, the second region 106, the third region 108, and the fourth region 110 increases the local pumping current density of the pumping nmoat 312 and triggers the SCR 12 quicker. For example, on test IC chips, a 40% TLP It2 improvement (in protecting nMOS outputs) was seen simply by reducing the width of the pumping nmoat 312 to a width below the width of the full SCR (e.g., the width $W_1$ of the first region 104, the second region 106, the third region 108, and the fourth region 110). After this point triggering, the current pumped by the external pumping circuit 142 (FIG. 4) can spread to occupy the entire width of the SCR 90 (FIG. 5).

Figure 9:
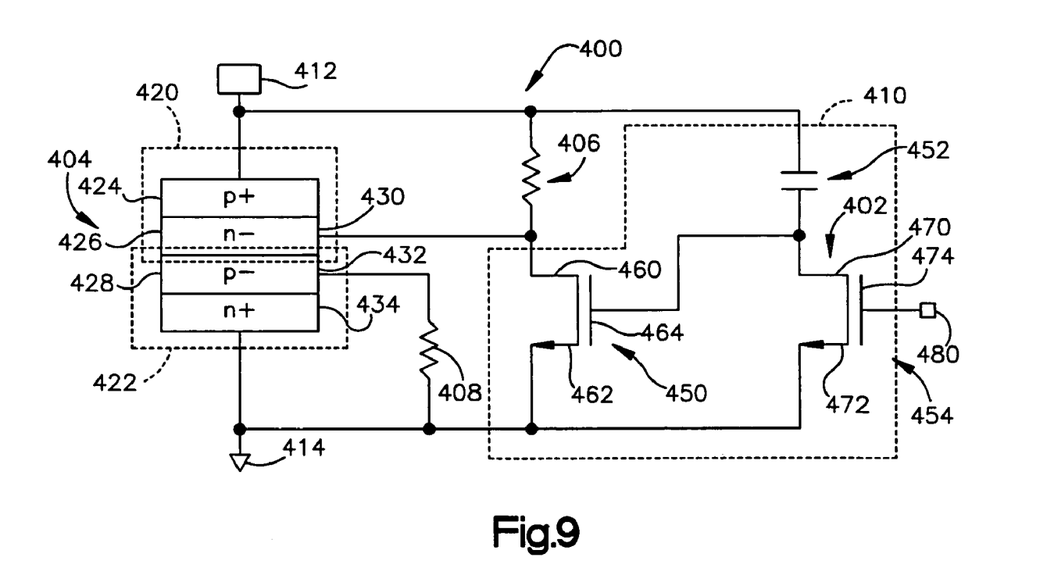
FIG. 9 illustrates a schematic circuit diagram of an ESD protection device in accordance with another aspect of the invention.

FIG. 9 illustrates a schematic circuit design of an ESD protection device 400 in accordance with another, aspect of the present invention. The ESD protection device 400 in accordance with this aspect of the invention has essentially the same design as the ESD protection device 10 of FIG. 3, except the resistor 54 of the external pumping circuit 14 can be replaced with a transistor, such an nMOSFET. That is, the ESD protection device 400 includes an SCR 404, a first resistor 406, a second resistor 408, and an external pumping circuit 410. The SCR 404 and the external pumping circuit 410 are electrically coupled in parallel between a protected node 412 and a grounded node 414.

The SCR 404 includes a pnp bipolar transistor 420 and an npn bipolar transistor 422. The pnp bipolar transistor 420 includes an emitter 424, a base 426, and a collector 428, and the npn bipolar transistor 422 includes an emitter 430, a base 432, and a collector 434. The emitter 424 of the pnp bipolar transistor 420 can be electrically coupled to the protected node 412, and can therefore receive an ESD event signal from the protected node 412. The emitter 434 of the npn bipolar transistor 422 can be electrically coupled to the grounded node 414. The emitter 434 of the npn bipolar transistor 422 can also be electrically coupled to the base 432 of the npn bipolar transistor 422 through the resistor 408. The base 426 of the pnp bipolar transistor 420 can be electrically coupled to a collector 430 of the npn bipolar transistor 422, and the collector 428 of the pnp bipolar transistor 420 can be electrically coupled to the base 432 of the npn bipolar transistor 422. The base 426 of the pnp bipolar transistor 420 and the collector 430 of the npn bipolar transistor 422 can be electrically coupled to the protected node 412 through the resistor 406. The base 426 of npn bipolar transistor 422 and the collector 428 of the pnp bipolar transistor 422 can be electrically coupled to the grounded node 414 through the resistor 408.

The external pumping circuit 410 can be electrically coupled between the base 426 of the pnp bipolar transistor 420 (or the collector 430 of the npn bipolar transistor 422) and the grounded node 414. The external pumping circuit 410 can include a first nMOSFET 450, a capacitor 452, and a second nMOSFET 454. The first nMOSFET 450 includes a drain 460, a source 462, and a gate 464, and the second nMOSFET 454 can includes a drain 470, a source 472, and a gate 474. The drain 460 of the first nMOSFET 450 can be electrically coupled to the base 426 of the pnp bipolar transistor 420 (or the collector 430 of the npn bipolar transistor 422). The source 462 of the first nMOSFET 450 can be electrically coupled to the grounded node 414 and the emitter 434 of the npn bipolar transistor 422. The gate 464 of the first nMOSFET 450 can be electrically coupled to the drain 470 of the second nMOSFET 454. The source 472 of the second nMOSFET 454 is electrically coupled to the grounded node 414 and the source 402 of the first nMOSFET 450. The gate 474 of the second nMOSFET 454 can be electrically coupled to a fixed voltage, such as a VDD 480.

The second nMOSFET 454 can act as a variable resistor during operation of the ESD protection device 400, as opposed to a constant resistor 54 as shown in FIG. 3. When VDD is applied to the gate 474, the second nMOSFET 454 will act to provide a transistor voltage at the gate 464 of the first nMOSFET 450. In this mode, the first nMOSFET 450 is off. When VDD is floating or grounded, the second nMOSFET 454 will act like an open circuit and form a powered off version of a resistor.

Figure 10:
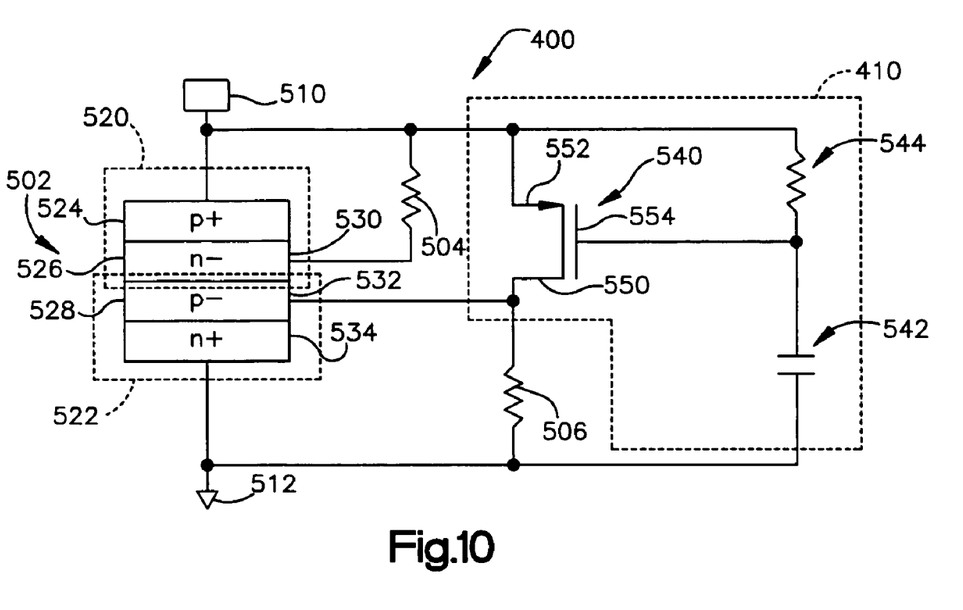
FIG. 10 illustrates a schematic circuit diagram of an ESD protection device in accordance with another aspect of the invention.

FIG. 10 illustrates a schematic circuit design of an ESD protection device 500 in accordance with another aspect of the present invention. The ESD protection device 500 in accordance with this aspect of the invention has essentially the same design as the ESD protection device 10 of FIG. 3 except a pMOSFET is used as the external pumping circuit instead of an nMOSFET. That is, the ESD protection device 500 includes a silicon controlled rectifier 502, a first resistor 504, a second resistor 506, and an external pumping circuit 508. The SCR 502 and the external pumping circuit 508 are electrically coupled in parallel between a protected node 510 and a grounded node 512.

The SCR 502 includes a pnp bipolar transistor 520 and an npn bipolar transistor 522. The pnp bipolar transistor 520 includes an emitter 524, a base 526, and a collector 528, and the npn bipolar transistor 522 includes an emitter 530, a base 532, and a collector 534. The emitter 524 of the pnp bipolar transistor 520 can be electrically coupled to the protected node 510, and can, therefore receive and ESD event signal from the protected node 510. The emitter 534 of the npn bipolar transistor 522 can be electrically coupled to the grounded node 512. The emitter 534 of the npn bipolar transistor 522 can also be electrically coupled to the base 532 of the npn bipolar transistor 522 through the resistor 522. The base 526 of the pnp bipolar transistor 520 can be electrically coupled to a collector 530 of the npn bipolar transistor 522, and the collector 528 of the pnp bipolar transistor 520 can be electrically coupled to the base 532 of the npn bipolar transistor 522. The base 526 of the pnp bipolar transistor 520 and the collector 530 of the npn bipolar transistor 522 can be electrically-coupled to the protected node 510 through the resistor 504. The base 532 of npn bipolar transistor 522 and the collector 528 of the pnp bipolar transistor 520 can be electrically coupled to the grounded node 512 through the resistor 506.

The external pumping circuit 508 can be electrically coupled between the emitter 524 of the pnp bipolar transistor 520 (and protected node 510) and the base 532 of the npn bipolar transistor 522 (or the collector 526 of the pnp bipolar transistor 520). The external pumping circuit 508 can include a pMOSFET 540, a capacitor 542, and a resistor 544. The pMOSFET 540 includes a drain 550, a source 552, and a gate 554. The drain of the pMOSFET 540 can be electrically coupled to the base 532 of the npn bipolar transistor 522 (or the collector 528 of the pnp bipolar transistor 520). The source of the pMOSFET 540 can be electrically coupled to the emitter 524 of the pnp bipolar transistor 520. The gate 554 of the pMOSFET 540 can be electrically coupled to the grounded node through capacitor 542, and to the protected node 510 through resistor 544.

Upon the occurrence of an ESD event, such as a voltage spike at the protected node 510, effective to cause the pMOSFET 540 to begin avalanching, the pMOSFET 540 pumps an avalanche-generated current to the base 532 of the npnp bipolar transistor 522 to pull down (i.e., lower) the potential of the base 532 and forward bias the npn bipolar transistor 522. Holes at the protected node 510 can flow to grounded node 512 through the npn bipolar transistor 522. Electrons from the grounded node 512 flow to the protected node 510. As a result, a positive feedback loop is formed to accelerate current flow for a discharge operation. The pnp bipolar transistor 520 and the npn bipolar transistor 522 provide base bias voltage for each other allowing the ESD protection device to remain conductive in a much lower holding voltage than the avalanche voltage.

Those skilled in the art will also understand and appreciate other variations in the ESD protection device in accordance with an aspect of the present invention. For example, it is to be appreciated that the nMOSFET used in one external pumping circuit can be replaced with a npn bipolar transistor, and the pMOSFET used on the other external pumping circuit can be replaced with a pnp bipolar transistor. Additionally, the external pumping circuit can use other triggering elements besides a capacitor. For example, a pMOSFET or other tranistor can be substituted for the capacitor. Moreover, it is appreciated that additional ESD protection devices can be formed on the substrate and these additional ESD protection devices can have multiple moats.

What has been described above includes examples and implementations of the present invention. Because it is not possible to describe every conceivable combination of components, circuitry or methodologies for purposes of describing the present invention, one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. An electrostatic discharge protection device comprising:
   a silicon controlled rectifier (SOR) constructed on a base region of a first conductivity type, the SOR including a well region of a second conductivity type formed in the base region, a first region of the first conductivity type formed in the well region, a second region of the second conductivity type formed in the well region, a third region of the first conductivity type formed in the base region, and a fourth region of the second conductivity type formed in the base region;
   an external pumping circuit comprising a transistor coupled to the well region or the base region, the transistor providing a pump current during an ESD event effective to lower the potential of the well region or the base region to which the transistor is coupled; and
   a fifth region of the second conductivity type formed at the interface between the well region and the base region, the transistor being coupled to the well region through the fifth region, wherein the fifth region having a first width and the first region, the second region, the third region, and the fourth region, each having a third width, the third width being greater than the first width of the fifth region.

2. The electrostatic discharge device of claim 1, the transistor comprising a metal-oxide semiconductor field effect transistor (MOSFET).

3. The electrostatic discharge device of claim 1, the transistor comprising a sixth region and a seventh region, the sixth region and the seventh region each having a second width greater than the first width.

4. The electrostatic discharge device of claim 1, the first conductivity type being a p-type and the second conductivity type comprising an n-type.

5. The electrostatic discharge device of claim 1, the second region being coupled to a protected node and the third region being coupled to a grounded node.

6. The electrostatic discharge device of claim 5, the transistor comprising an nMOSFET with a drain, a source, and a gate, the drain being coupled to the fifth region, the source being coupled to the grounded node, and the gate being coupled to the protected node.

7. The electrostatic discharge device of claim 6, the external pumping circuit further comprising a capacitor and a resistor, the gate being coupled to the protected node through the capacitor, the gate being coupled to the source through the resistor.

8. The electrostatic discharge device of claim 7, the base region being a p-type substrate, the well region being an n-well, the first region and fourth region comprising $p^+$ type dopants, and the second region, the third region, and the fifth region comprising $n^+$ type dopants.

9. An electrostatic discharge protection device comprising:
a silicon controlled rectifier (SOR) constructed on a base region of a first conductivity type, the SOR including a well region of a second conductivity type formed in the base region, a first region of the first conductivity type formed in the well region, a second region of the second conductivity type formed in the well region, a third region of the first conductivity type formed in the base region, and a fourth region of the second conductivity type formed in the base region; each of the first, second, third, and fourth region having a first width, and
an external pumping circuit comprising a transistor coupled to the well region or to the base region, the transistor including a sixth region and a seventh region of the first conductivity type or the second conductivity type, the sixth region and the seventh region having a second width substantially greater than the first width, the transistor providing a pump current to the SCR during an ESD event effective to lower the potential of the well region or the base region to which the transistor is coupled.

10. The electrostatic discharge device of claim 9, the transistor comprising a metal-oxide semi-conductor field effect transistor (MOSFET) or a bipolar junction transistor (BJT).

11. The electrostatic discharge device of claim 9, further comprising a fifth region of a second conductivity type formed at an interface between the well region and the base region, the transistor being coupled to the well region through the fifth region.

12. The electrostatic discharge device of claim 11, the fifth region having a third width substantially smaller the first width and the second width.

13. The electrostatic discharge device of claim 11, the first conductivity type being a p-type and the second conductivity type being an n-type.

14. The electrostatic discharge device of claim 11, the second region being coupled to a protected node and the third region being coupled to a grounded node.

15. The electrostatic discharge device of claim 14, the transistor comprising an nMOSFET having a drain, a source, and a gate, the drain being coupled to the fifth region, the source being coupled to the grounded node, and the gate being coupled to the protected node.

16. The electrostatic discharge device of claim 15, the external pumping circuit further comprising a capacitor and a resistor, the gate being coupled to the protected node through the capacitor, the gate being coupled to the source through the resistor.

17. The electrostatic discharge device of claim 16, the base region being a p-type substrate, the well region being an n-well, the first region and fourth region comprising $p^+$ type dopants, and the second region, the third region, the fifth region, the sixth region, and the seventh region comprising $n^+$ type dopants.

18. An electrostatic discharge protection device comprising:
a silicon controlled rectifier (SCR) constructed p-type substrate, the SCR including an n-well region formed in the p-type substrate with a first nmoat formed in the n-well region, a first pmoat formed in the n-well region, a second nmoat formed in the p-type substrate, a second pmoat formed in the p-type substrate, and a third nmoat formed at an interface between the n-well region and p-type substrate, the third nmoat having a first width; and
an external pumping circuit comprising an nMOSFET, the nMOSFET including a source, a drain, and a gate, the drain being coupled to the third nmoat, the source and drain each having a second width effective to provide a pump current during an ESD event to the third nmoat to lower the potential of the nwell region, the ratio of the second width to the first width being at least about three to one.

19. The electrostatic discharge device of claim 18, the first pmoat being coupled to a protected node and the second nmoat being coupled to a grounded node.

20. The electrostatic discharge device of claim 18, the external pumping circuit further comprising a capacitor and a resistor, the gate being coupled to the protected node through the capacitor, the gate being coupled to the source through the resistor.

21. The electrostatic discharge device of claim 18, the ratio of the second width to the first width being at least about twelve to one.

* * * * *